United States Patent
Changchien et al.

(10) Patent No.: US 10,269,591 B2
(45) Date of Patent: *Apr. 23, 2019

(54) METHOD OF SELECTIVELY REMOVING SILICON NITRIDE AND SINGLE WAFER ETCHING APPARATUS THEREOF

(71) Applicant: TAIWAN SEMICONDUCTOR MANUFACTURING CO., LTD., Hsinchu (TW)

(72) Inventors: Ying-Hsueh Changchien, Hsinchu (TW); Yu-Ming Lee, New Taipei (TW); Chi-Ming Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 11 days.

This patent is subject to a terminal disclaimer.

(21) Appl. No.: 14/061,602

(22) Filed: Oct. 23, 2013

(65) Prior Publication Data
US 2015/0111390 A1 Apr. 23, 2015

(51) Int. Cl.
*H01L 21/311* (2006.01)
*H01L 21/67* (2006.01)

(52) U.S. Cl.
CPC .... *H01L 21/6708* (2013.01); *H01L 21/31111* (2013.01)

(58) Field of Classification Search
None
See application file for complete search history.

(56) References Cited

U.S. PATENT DOCUMENTS

| | | | | |
|---|---|---|---|---|
| 3,811,974 A * | 5/1974 | Squillance et al. | ........................... H01L 21/31111 216/13 |
| 5,470,421 A * | 11/1995 | Nakada | ............. H01L 21/67086 210/750 |
| 6,123,865 A * | 9/2000 | Lin | .................... H01L 21/31111 134/1.3 |
| 6,162,370 A * | 12/2000 | Hackett | ............. H01L 21/31116 252/79.1 |
| 2001/0001728 A1* | 5/2001 | Jan | .................... H01L 21/31111 438/689 |
| 2004/0200806 A1* | 10/2004 | Izuta | ........................ C23F 1/46 216/99 |
| 2004/0242019 A1* | 12/2004 | Klein | ..................... C09K 13/04 438/757 |
| 2005/0266692 A1* | 12/2005 | Brask | .................. H01L 21/3081 438/717 |

(Continued)

FOREIGN PATENT DOCUMENTS

CN 101202151 A 6/2008
CN 101231939 A 7/2008
(Continued)

*Primary Examiner* — Shamim Ahmed
(74) *Attorney, Agent, or Firm* — McDermott Will & Emery LLP

(57) ABSTRACT

A method of selectively removing silicon nitride is provided. The method includes: providing a wafer having silicon nitride on a surface of the wafer; providing a mixture of phosphoric acid and a silicon-containing material; and delivering the mixture to the surface of the wafer to remove the silicon nitride. Single wafer etching apparatuses of selectively removing silicon nitride are also provided.

20 Claims, 3 Drawing Sheets

300

PROVIDE WAFER HAVING SILICON NITRIDE S1

PROVIDE MIXTURE OF PHOSPHORIC ACID AND SILICON-CONTAINING MATERIAL S2

DELIVER MIXTURE TO SURFACE OF WAFER S3

(56) References Cited

U.S. PATENT DOCUMENTS

| | | | |
|---|---|---|---|
| 2006/0263251 A1* | 11/2006 | Watatsu | H01L 22/14 422/68.1 |
| 2007/0246805 A1 | 10/2007 | Zhang et al. | |
| 2008/0179293 A1* | 7/2008 | Wei | H01L 21/31111 216/84 |
| 2008/0203060 A1* | 8/2008 | Hara | H01L 21/31111 216/99 |
| 2012/0145672 A1* | 6/2012 | Ratkovich | H01L 21/31111 216/83 |
| 2012/0187083 A1* | 7/2012 | Hashizume | H01L 21/3105 216/37 |
| 2013/0102109 A1* | 4/2013 | Stewart | H01L 31/02167 438/98 |
| 2013/0203262 A1* | 8/2013 | Butterbaugh | H01L 21/31111 438/748 |
| 2014/0231013 A1* | 8/2014 | Hinode | C09K 13/04 156/345.23 |
| 2015/0111311 A1* | 4/2015 | Changchien | H01L 21/31111 438/5 |
| 2016/0013068 A1* | 1/2016 | Butterbaugh | H01L 21/31111 438/748 |

FOREIGN PATENT DOCUMENTS

| | | | |
|---|---|---|---|
| CN | 102270532 A | | 12/2011 |
| JP | 2000-058500 A | * | 2/2000 |
| JP | 2007-12640 A | * | 1/2007 |

* cited by examiner

METHOD OF SELECTIVELY REMOVING SILICON NITRIDE AND SINGLE WAFER ETCHING APPARATUS THEREOF

BACKGROUND

A wet etching process is utilized to etch material from target locations on a semiconductor substrate during fabrication of integrated circuits (ICs). The success of the wet etching process requires an etching chemistry that includes chemical compositions suitable for selectively removing one material while substantially not removing another material. Therefore, various chemical compositions have been developed for removal of specific classes of materials from substrates in semiconductor wafer technologies.

Silicon nitride is commonly used as a cap layer, spacer layer or hard mask layer in semiconductor devices. Generally, a silicon nitride layer on the semiconductor substrate is selectively etched and removed by soaking the substrate in a hot phosphoric acid bath for a period of time. Nevertheless, in the etching process, particles such as silica precipitates may be generated and then accumulated in the bath so as to reduce etching performance and shorten bath age. Besides, cross-contamination among semiconductor substrates may occur, and thus a post-cleaning process, which results in extra manufacturing cost, is needed to clean each of the semiconductor substrates. Given the above, it remains desirable to provide a process without the post-cleaning process to save the manufacturing cost.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
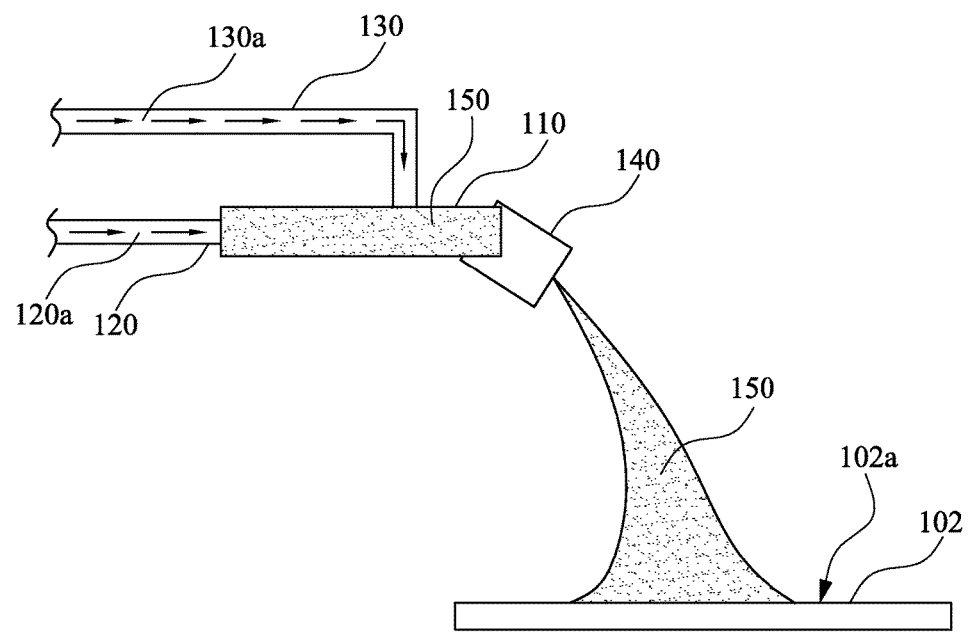
FIG. 1 is a schematic diagram of a single wafer etching apparatus according to various embodiments of the present disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a silicon nitride layer includes embodiments having two or more such silicon nitride layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

In selectively etching and removing a silicon nitride layer on the semiconductor substrate, a batch process may be performed by soaking the substrate in a hot phosphoric acid bath for a period of time. In the batch process, particles such as silica precipitates may be generated and then accumulated in the hot phosphoric acid bath. A single wafer process is applied to address the particle accumulation issue in the batch process. The etching by the single wafer process is a method for etching a wafer by dropping an etching fluid, e.g., phosphoric acid, on the upper surface of the wafer, horizontally rotating (spinning) the wafer so as to spread the etching fluid over the whole area of the upper surface of the wafer, and etching the wafer. However, the higher the temperature of phosphoric acid (i.e., the higher the etch rate), the lower the selectivity of silicon nitride to silicon oxide (hereinafter referred to "selectivity"). Maintaining sufficient high selectivity scarifies the etch rate and leads to low throughput. The problem of low throughput is more serious in the single wafer process than in the batch process. Thus, it is still a difficult task of etching silicon nitride by the single wafer process with satisfactory throughput.

Etching silicon nitride by phosphoric acid may be described by the following Equation (1):

$$Si_3N_4 + 4H_3PO_4 + 10H_2O \rightarrow 4NH_4H_2PO_4 + 9Si_3O_2(OH)_8 \qquad (1)$$

In Equation (1), in the presence of phosphoric acid and water, the nitrogen atom in silicon nitride is dislodged and attaches to an $H_2PO_4$ cation, and thus forms ammonium phosphate ($NH_4H_2PO_4$). The silicon atom is oxidized and thus forms hydrous silica ($Si_3O_2(OH)_8$) in solution, which inhibits the etching of silicon oxide. If an amount of the hydrous silica is increased, etch rate of silicon oxide will be significantly decreased due to Le Chatelier's principle, resulting in high selectivity. Accordingly, the present disclosure provides a novel single wafer process including providing a mixture of phosphoric acid and a silicon-containing material, which the mixture has high selectivity, and then delivering the mixture to the upper surface of the wafer to etch silicon nitride. As such, according to various embodiments of the present disclosure, the problem of low throughput mentioned above can be solved. The selectivity of the etching solution is as great as possible. In various embodiments, the selectivity is greater than or equal to 100:1.

In order to perform the single wafer etching process, a single wafer etching apparatus is provided. FIG. 1 is a schematic diagram of a single wafer etching apparatus 100 according to various embodiments of the present disclosure. The etching apparatus 100 may be contained within a hermetic chamber (not shown). The hermetic chamber may be used to avoid contamination and maintain environmental stability of the etching apparatus 100. The etching apparatus 100 is used to perform the single wafer process on a wafer 102 having silicon nitride on a surface 102a thereof. In one embodiment, the wafer 102 has a silicon nitride layer (not shown) located on the surface 102a thereof.

The etching apparatus 100 of selectively removing silicon nitride includes a container 110, first and second component suppliers 120, 130 for respectively supplying phosphoric acid 120a and the silicon-containing material 130a, and a mixture deliver 140 for delivering a mixture 150 from the container 110 to the surface 102a of the wafer 102 having silicon nitride thereon.

In the depicted embodiment, the first component supplier 120 connected the container 110 for supplying phosphoric acid 120a is a piping line. Phosphoric acid 120a may be provided from a liquid supply reservoir (not shown) through the piping line. The etching apparatus 100 may further include a heater (not shown) that preheats phosphoric acid 120a to a predetermined temperature. In various embodiments, the predetermined temperature is in a range of about 100° C. to about 180° C. In various embodiments, the predetermined temperature is in a range of about 120° C. to about 170° C. The heater may be disposed covering a portion of the piping line but not limited thereto.

In the current embodiment, the second component supplier 130 connected to the container 110 for supplying the silicon-containing material 130a is a piping line. Thus, the mixture 150 of phosphoric acid 120a and the silicon-containing material 130a is formed in the container 110. In various embodiments, the silicon-containing material 130a is organosilane, organosiloxane, colloidal silica, electrolyzed silicon or a combination thereof, or a silicon oxide powder. In one embodiment, the silicon-containing material 130a is flowable and provided from another liquid supply reservoir (not shown) through the piping line. The etching apparatus 100 may further include a heater (not shown) that preheats the silicon-containing material 130a to a predetermined temperature. The heater may be disposed covering a portion of the piping line but not limited thereto.

The container 110 is coupled to the first and second component suppliers 120, 130, such that phosphoric acid 120a and the silicon-containing material 130a mix to form the mixture 150. In addition, the etching apparatus 100 may include a heater (not shown) that heats the mixture 150 to a predetermined temperature. In various embodiments, the predetermined temperature is in a range of about 100° C. to about 180° C. In various embodiments, the predetermined temperature is in a range of about 120° C. to about 170° C. The heater may be disposed covering an outer wall of the container 110 but not limited thereto.

In the depicted embodiment, the mixture deliver 140 coupled to the container 110 for delivering the mixture 150 therefrom to the surface 102a of the wafer 102 is a nozzle or a dispensor. The mixture deliver 140 is used to provide a stream of the mixture 150 to the surface 102a of the wafer 102. In various embodiments, the nozzle is a fixed nozzle or a movable nozzle. Some embodiments may have the fixed nozzle and a wafer holding by a movable stage. Some embodiments may have the movable nozzle hovering over each wafer. The locations of the nozzle 140 and the wafer 102 and the direction of the stream may be adjusted to effect the desired etching treatment.

Furthermore, the etching apparatus 100 may include a rotatable chuck (not shown) disposed beneath the wafer 102 and thus able to horizontally rotate (spin) the wafer 102 to spread the mixture 150 over entire surface 102a.

Figure 2:
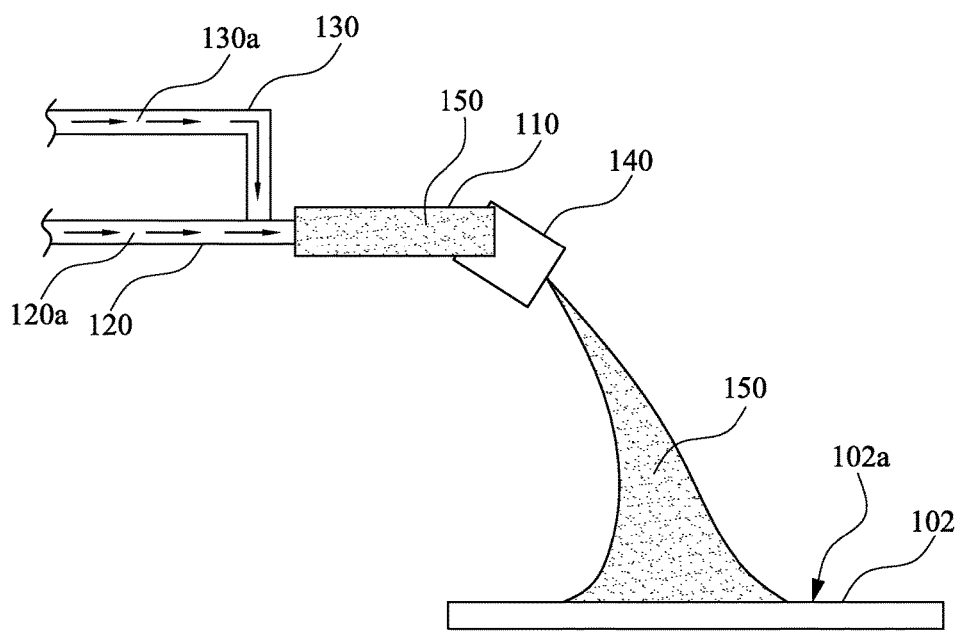
FIG. 2 is a schematic diagram of a single wafer etching apparatus according to various embodiments of the present disclosure.

However, phosphoric acid and the silicon-containing material may be premixed before entering the container. FIG. 2 is a schematic diagram of a single wafer etching apparatus 200 according to various embodiments of the present disclosure. The second component supplier 130 is coupled to the first component supplier 120, and thus phosphoric acid 120a and the silicon-containing material 130a can be premixed before entering the container 110.

Figure 3:
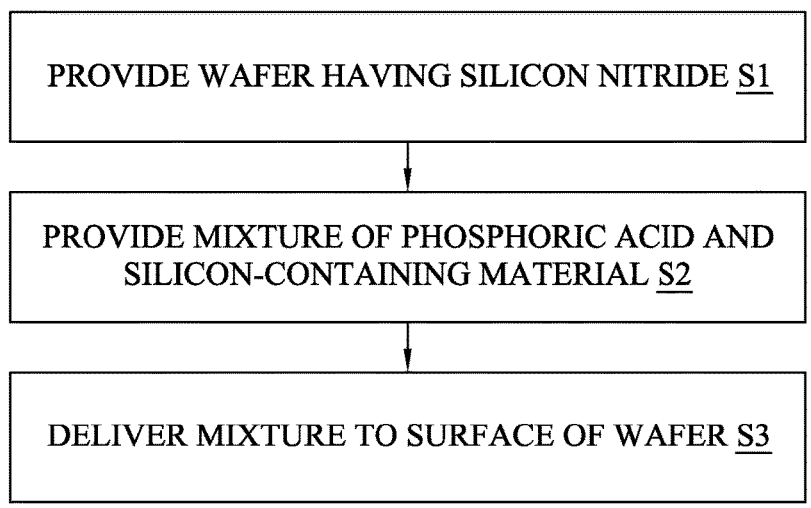
FIG. 3 is a flow chart illustrating a method of selectively etching silicon nitride according to various embodiments of the present disclosure.

FIG. 3 is a flow chart illustrating a method 300 of etching silicon nitride according to various embodiments of the present disclosure. The method 300 (i.e., the single wafer process) may be performed by using a single wafer etching apparatus, such as the etching apparatuses 100, 200 of FIGS. 1-2.

In operation S1, a wafer having silicon nitride on a surface of the wafer is provided. In one embodiment, the wafer has a silicon nitride layer disposed on the surface thereof. The wafer may further include other materials or structures of a semiconductor or electronics device. In one embodiment, the wafer further has silicon oxide. Thus, an etching solution with high selectivity is provided and thus able to be used in the single wafer process.

In operation S2, a mixture (i.e., the etching solution) of phosphoric acid and a silicon-containing material is provided. In various embodiments, the silicon-containing material is organosilane, organosiloxane, colloidal silica, electrolyzed silicon or a combination thereof.

The organosilane or organosiloxane is a compound in which the basic atom or basic skeleton includes Si or Si—O and each of the side groups includes an organic group (e.g., an alkyl group such as methane or ethane, an alkoxyl group such as a methoxy group, an ethoxy group, an acetoxyl group, an aryl group, or the like). Examples of the organosilane and organosiloxane include tetraethoxysilane (TEOS), tetramethoxysilane (TMOS), tetramethylsilane, tetramethylcyclotetrasiloxane, octomethylcyclotetrasiloxane, and diacetoxy-di-tertbutoxysilane, but not limited thereto. In one embodiment, the silicon-containing material is TEOS, which is easily dissolved in phosphoric acid to significantly inhibit the etching of silicon oxide. The organic group may be substituted, for example, by a halogen, a hydrogen atom, a hydroxyl group and an NH (ammonia) group.

The colloidal silica may be formed by any conventional method, such as ion exchange or addition of an aqueous solution of an alkali metal hydroxide to solid silica. The colloidal silica can be dispersed in a solvent (e.g., water) to form colloidal silica solution that is more easily dissolved in phosphoric acid.

The electrolyzed silicon may be fabricated by electrolyzing silicon-containing compound (e.g., silicon-containing salt). The electrolyzed silicon can be uniformly mixed with phosphoric acid.

In other embodiments, the silicon-containing material is a silicon oxide powder, such as the silicon oxide powder of chemical mechanical polishing (CMP) slurry. The silicon oxide powder will be etched by phosphoric acid and thus to form the homogeneous mixture.

It is noteworthy that the silicon concentration should not exceed the silicon saturation concentration so as to avoid forming silica precipitates. In various embodiments, the silicon-containing material has a silicon concentration less than about 200 ppm based on the weight of the mixture. In various embodiments, the mixture has a silicon concentration less than about 120 ppm based on the weight of the mixture. The silicon saturation concentration is varied with the temperature of the process.

In one embodiment, the mixture is heated to a predetermined temperature. In various embodiments, the predetermined temperature is in a range of about 100° C. to about 180° C. In various embodiments, the predetermined temperature is in a range of about 120° C. to about 170° C.

In various embodiments, operation S2 includes: supplying phosphoric acid and the silicon-containing material; and mixing phosphoric acid and the silicon-containing material to form the mixture. For an example, as shown in FIG. 1, phosphoric acid and the silicon-containing material are mixed in the container 110. For another example, the silicon-containing material 130a is premixed with phosphoric acid 120a before entering the container 110, as shown in FIG. 2. In one embodiment, phosphoric acid is preheated to a predetermined temperature before mixing phosphoric acid and the silicon-containing material. In various embodiments, the predetermined temperature is in a range of about 100° C. to about 180° C. In various embodiments, the predetermined temperature is in a range of about 120° C. to about 170° C.

Additionally, it is noteworthy that, the selectivity is dependant on the silicon concentration. For specific examples, the mixtures having the silicon concentration of 0 (comparative example), 40, 60, 80 and 100 ppm by adding various amounts of TEOS, $SiO_2$ or some Si-containing compounds into phosphoric acid respectively have selectivity of 40:1, 150:1, 225:1, 175:1 and 250:1 at 150 to 155° C. Therefore, each of the above mixtures of the present disclosure can be directly used in the single wafer process because of its extremely high selectivity. Besides, in the above examples, the mixtures with the silicon concentration of 0, 40, 60, 80 and 100 ppm have etch rate of silicon nitride of about 5-6 nm/min at 150 to 155° C. As such, the silicon concentration has minimal impact on the etch rate of silicon nitride.

In operation S3, the fresh mixture is delivered to the surface of the wafer to remove silicon nitride. In one embodiment, operation S3 is conducted by spraying the mixture onto the surface of the wafer. In addition, the method 300 may include spreading the mixture on the surface of the wafer after operation S3.

As mentioned above, the single wafer process of selectively removing silicon nitride and the single wafer etching apparatus thereof are provided to solve the particle accumulation issue arising from the batch process. In another aspect, the mixture can be used in the single wafer process because of its extremely high selectivity, and thus to exhibit enough high etch rate of silicon nitride and satisfactory throughput.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of selectively removing silicon nitride, comprising:

providing a wafer having silicon nitride on a surface of the wafer;

providing phosphoric acid and adding tetraethoxysilane (TEOS) to the phosphoric acid through a piping line to form a mixture, the TEOS having a silicon concentration greater than or equal to 40 ppm based on the weight of the mixture and less than about 120 ppm based on the weight of the mixture; and while providing the phosphoric acid and adding the TEOS to the phosphoric acid to form the mixture, delivering, through a nozzle, the mixture having a temperature greater than or equal to about 100° C. and lower than 120° C. to the surface of the wafer to remove the silicon nitride.

2. The method of claim 1, wherein adding the TEOS to the phosphoric acid comprises:

supplying the phosphoric acid and the TEOS; and mixing the phosphoric acid and the TEOS to form the mixture.

3. The method of claim 1, wherein delivering the mixture to the surface of the wafer is conducted by spraying the mixture onto the surface of the wafer.

4. The method of claim 1, further comprising spreading the mixture on the surface of the wafer after delivering the mixture to the surface of the wafer.

5. The method of claim 1, wherein the wafer further has silicon oxide.

6. The method of claim 2, wherein supplying the phosphoric acid and the TEOS comprises respectively supplying the phosphoric acid and the TEOS via a first component supplier and the piping line.

7. The method of claim 2, wherein supplying the phosphoric acid and the TEOS comprises respectively supplying the phosphoric acid and the TEOS via a first component supplier and the piping line into a container.

8. The method of claim 1, wherein adding the TEOS to the phosphoric acid comprises:

supplying the phosphoric acid via a first component supplier into a container; and supplying the TEOS via the piping line into the first component supplier to premix the phosphoric acid and the TEOS.

9. The method of claim 1, wherein the nozzle is a fixed nozzle.

10. The method of claim 1, wherein the nozzle is a movable nozzle.

11. The method of claim 4, wherein spreading the mixture on the surface of the wafer in conducted by horizontally rotating the wafer.

12. The method of claim 11, wherein horizontally rotating the wafer is conducted by using a rotatable chuck.

13. The method of claim 1, wherein delivering the mixture to the surface of the wafer is conducted by dropping the mixture onto the surface of the wafer.

14. The method of claim 5, wherein the mixture has selectivity of the silicon nitride to the silicon oxide greater than or equal to 100:1.

15. The method of claim 1, wherein the silicon concentration of the TEOS is less than 100 ppm based on the weight of the mixture.

16. A method, comprising:

mixing a phosphoric acid with a silicon-containing material to form a mixture, wherein the silicon-containing material has a silicon concentration between about 40 ppm and about 120 ppm based on the weight of the mixture;

heating the mixture at a temperature between about 100° C. and about 120° C.; and delivering the mixture to a surface of a wafer.

17. The method of claim 16, further comprising:

heating the mixture in a container.

18. The method of claim 16, further comprising:

heating the phosphoric acid before mixing the phosphoric acid with the silicon-containing material.

19. A method, comprising:

providing a phosphoric acid and adding a silicon-containing material to the phosphoric acid to form a mixture, wherein the silicon-containing material has a silicon concentration between about 40 ppm and about 200 ppm based on the weight of the mixture;

heating the mixture at a temperature between about 100° C. and about 125° C.; and delivering the mixture to a surface of a wafer.

20. The method of claim 19, wherein the mixture is heated at a temperature between about 100° C. and about 120° C.

* * * * *